(12) United States Patent
Lee

(10) Patent No.: US 10,998,173 B2
(45) Date of Patent: May 4, 2021

(54) TWO-PHASED ATMOSPHERIC PLASMA GENERATOR

(71) Applicant: Nova Engineering Films, Inc., Los Altos Hills, CA (US)

(72) Inventor: Sang In Lee, Los Altos Hills, CA (US)

(73) Assignee: NOVA ENGINEERING FILMS, INC., Los Altos Hills, CA (US)

( * ) Notice: Subject to any disclaimer, the term of this patent is extended or adjusted under 35 U.S.C. 154(b) by 210 days.

(21) Appl. No.: 16/216,787

(22) Filed: Dec. 11, 2018

(65) Prior Publication Data
US 2019/0189405 A1    Jun. 20, 2019

Related U.S. Application Data

(60) Provisional application No. 62/598,936, filed on Dec. 14, 2017.

(51) Int. Cl.
H01J 37/32 (2006.01)
H01J 37/34 (2006.01)

(52) U.S. Cl.
CPC .. *H01J 37/32825* (2013.01); *H01J 37/32073* (2013.01); *H01J 37/32348* (2013.01); *H01J 37/32357* (2013.01); *H01J 37/32577* (2013.01); *H01J 37/34* (2013.01); *H01J 2237/327* (2013.01)

(58) Field of Classification Search
CPC .......... H01J 37/32825; H01J 37/32073; H01J 37/32348; H01J 37/32357; H01J 37/32577; H01J 37/34; H01J 2237/327; E21B 43/34; E21B 43/26; C02F 1/4608; C02F 2103/10; C02F 2201/46175; C02F 2101/32; C02F 2201/02; C02F 1/5236; C02F 1/488; C02F 2103/365; B03C 1/01; B03C 11/00; B03C 1/02; B03C 2201/02; H05H 1/2406; H05H 2001/2462; H05H 2001/245

See application file for complete search history.

(56) References Cited

U.S. PATENT DOCUMENTS

| 2014/0262826 A1* | 9/2014 | Rao .......................... C02F 9/00 205/751 |
| 2015/0179411 A1* | 6/2015 | Laux ................. H01J 37/32568 423/659 |
| 2017/0081221 A1* | 3/2017 | Namihira ................ E21B 43/34 |

* cited by examiner

*Primary Examiner* — Xiuyu Tai
(74) *Attorney, Agent, or Firm* — Fenwick & West LLP

(57) ABSTRACT

A plasma generator includes an outer electrode that encloses a first inner electrode and a second inner electrode. The first inner electrodes includes a plurality of protrusions that extend towards the outer electrode. A voltage signal can be applied across the outer electrode and the first inner electrode to excite gas injected into gaps between the protrusions and the outer electrode. Plasma is generated surrounding the protrusions. The second inner electrode is at a downstream location of the excited gas relative to the first inner electrode. The second inner electrode forms a second gap with the outer electrode. A voltage signal can be applied across the second inner electrode and the outer electrode, further exciting the gas to generate second plasma at the second gap. The second plasma is spread evenly across the second inner electrode and the outer electrode.

15 Claims, 13 Drawing Sheets

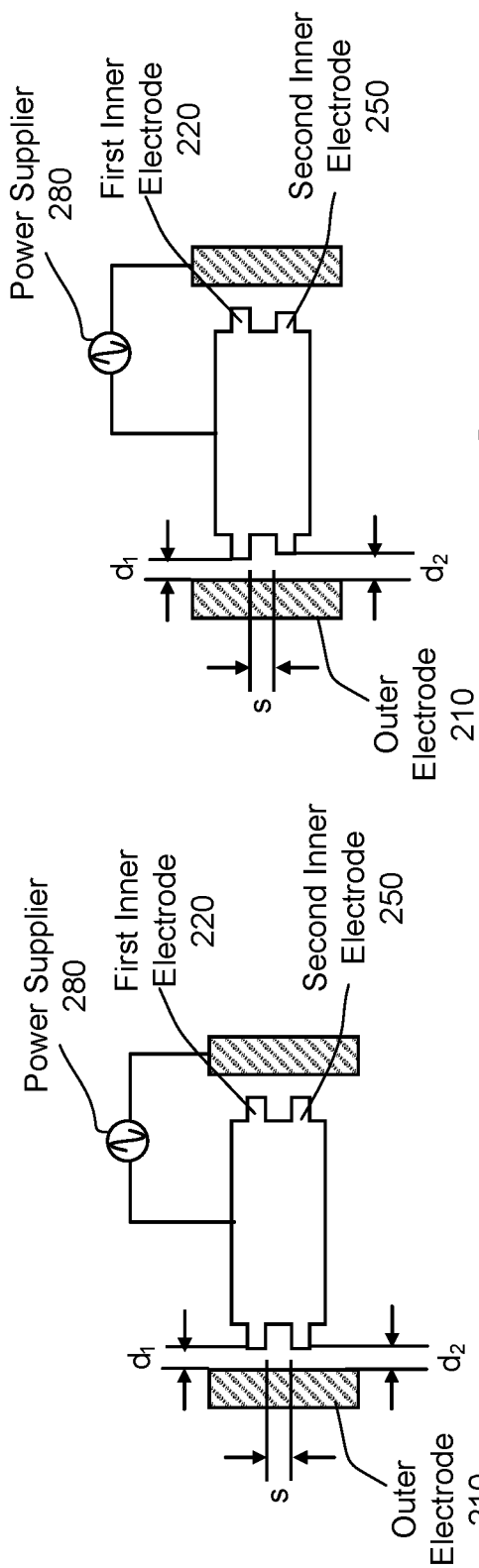
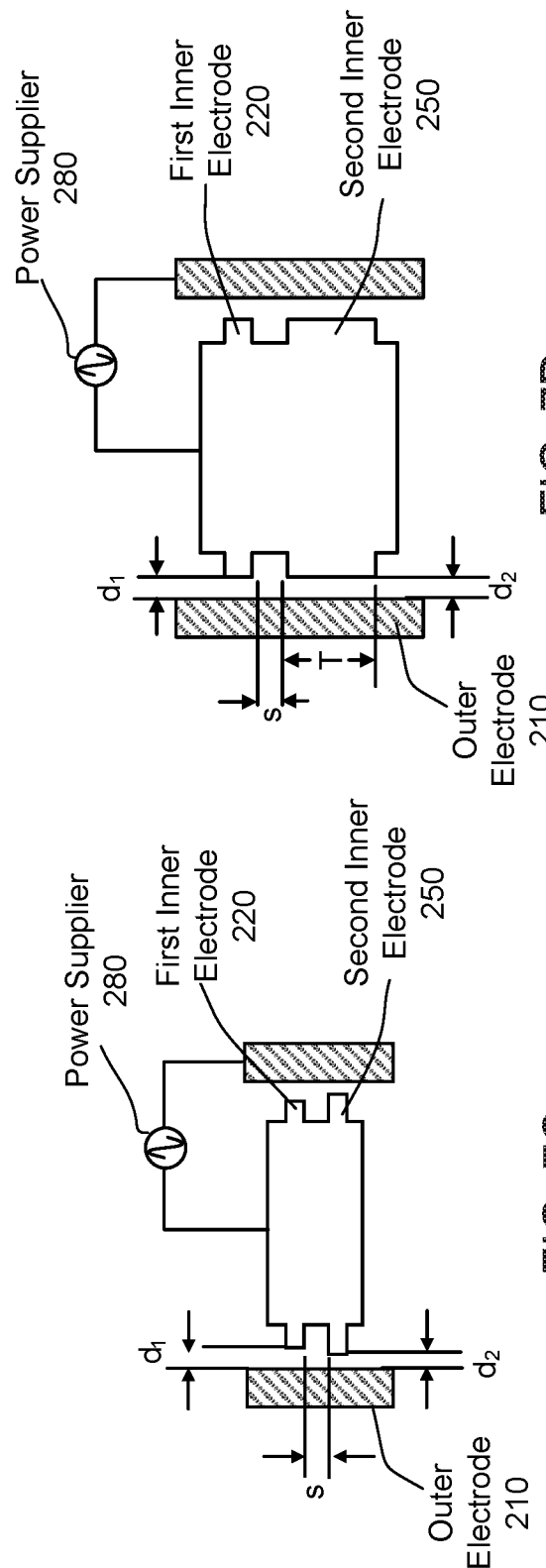
FIG. 7A
FIG. 7B
FIG. 7C
FIG. 7D

TWO-PHASED ATMOSPHERIC PLASMA GENERATOR

CROSS-REFERENCE TO RELATED APPLICATION

This application claims the benefit of U.S. Provisional Patent Application No. 62/598,936, filed on Dec. 14, 2017, which is incorporated by reference herein in its entirety.

BACKGROUND

Field of the Disclosure

The present disclosure generally relates to plasma generator, and specifically to a two-phase plasma generator operable under atmospheric pressure.

Description of the Related Arts

Atmospheric pressure plasma is a plasma in which the pressure approximately matches the pressure of the surrounding atmosphere. There is no need to maintain a pressure of a different level to employ atmospheric pressure plasma. Also, the need for cost-intensive chambers for producing vacuum can be eliminated. Atmospheric pressure plasma can be applied directly in production lines and is used in industry for surface treatment, such as surface activation, surface reaction, and annealing.

Conventional systems for generating atmospheric pressure plasma apply AC or DC voltage signals across a serrated electrode to produce corona discharges. The corona discharges break down a fluid (air or gas) and form plasma. However, because corona discharges usually form at highly curved regions, the plasma has higher density at these regions but have lower density at other regions. Spatial variation of the plasma density, when used for surface treatment, can cause non-uniform plasma treatment.

SUMMARY

Embodiments relate to a two-phase plasma generator operable under atmospheric pressure. The two-phase plasma generator includes a first inner electrode and a second inner electrode that are enclosed in an outer electrode. The first inner electrode includes a body and a group of protrusions attached on the body. Each of the protrusions extends towards the outer electrode and defines a first gap with the outer electrode. The second inner electrode has an outer surface facing the outer electrode and forms a second gap with the outer electrode. The outer surface of the second inner electrode can be a smooth surface. Alternatively, the second inner electrode can include protrusions extending towards the outer electrode where the number of the protrusions of the second inner electrode is larger than the number of the protrusions of the first inner electrode.

In one or more embodiments, the two-phase plasma generator includes a gas channel that is connected to holes for injecting a gas into the first gaps of the two-phase plasma generator. The gas further flows from the first gaps to the second gap. Thus, the second inner electrode is at a downstream location of the gas relative to the first inner electrode.

In one or more embodiments, a voltage signal can be applied across the outer electrode and the two inner electrodes to ionize the gas to generate plasma. The gas is first excited between the first inner electrode and the outer electrode to form first plasma. The first plasma has high density in the first gaps surrounding the protrusions of the first inner electrode but low (or even zero) density between the body of the first inner electrode and the outer electrode. The excited gas then flows to the second gap and is further excited between the second inner electrode and the outer electrode to form second plasma. The second plasma is spread more evenly across the outer surface of the second inner electrode and the outer electrode than the first plasma. The first plasma phase has a smaller area for generating plasma and higher plasma density than those of the second plasma phase.

In one embodiment, a first voltage signal applied across the first inner electrode and the common outer electrode, and a second voltage signal applied across the second inner electrode and the common outer electrode can be either in phase or out of phase.

BRIEF DESCRIPTION OF THE DRAWINGS

The teachings of the embodiments can be readily understood by considering the following detailed description in conjunction with the accompanying drawings.

FIGS. 7A through 7D illustrate various configurations of spatial separation between the outer electrode and the two inner electrodes of the two-phase plasma generator, in accordance with embodiments.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to a plasma generator that produces relatively consistent and even plasma in atmospheric conditions. The plasma generator includes an outer electrode, a first inner electrode, and a second inner electrode. The first inner electrode includes a group of protrusions, which forms a group of first gaps with the outer electrode. A gas can be injected into the first gaps. Relative to the first inner electrode, the second inner electrode is located at a downstream location of the gas. The second inner electrode has an outer surface that forms a second gap with the outer electrode. The excited gas flows from the first gaps to the second gap. Compared with density of the first plasma, density of the second plasma has a more uniform distribution across the outer surface of the second inner electrode and outer electrode.

Figure 1A:
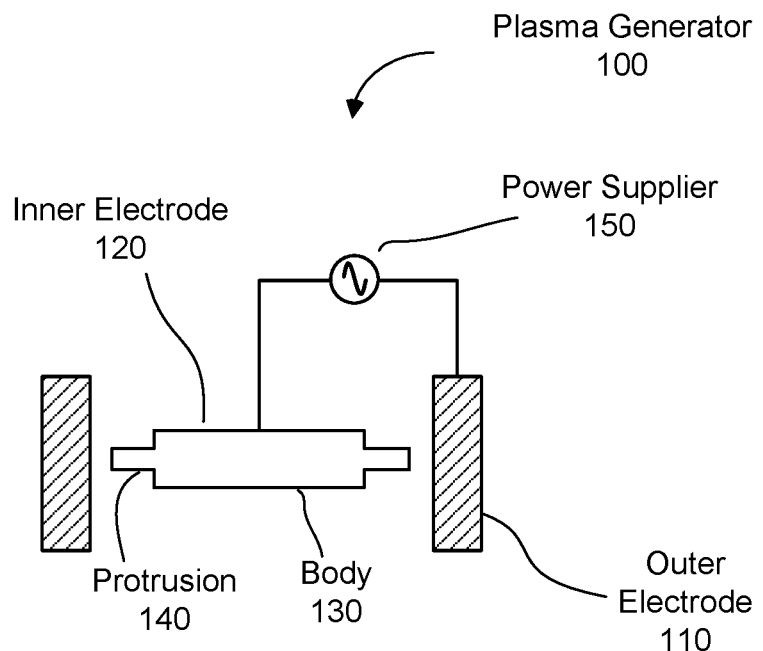
FIG. 1A is a schematic cross-sectional view of a plasma generator, in accordance with an embodiment.

FIG. 1A is a schematic view of a single-phase plasma generator 100, in accordance with an embodiment. The plasma generator 100 includes an outer electrode 110 and an inner electrode 120. The inner electrode 120 includes a body 130 and protrusions 140 attached on the body 130. FIG. 1A shows two protrusions 140 at opposite sides of the body 130, but many more protrusions of inner electrode 120 surround the body 130. The body 130 can have a cylindrical shape and protrusions 140 are spread around the cylindrical body 130. The protrusions can be a conductive material such as metal or conductive ceramic for a corona discharge plasma, or dielectric-covered metal for a dielectric-barrier-discharge (DBD) plasma.

A gas can be injected into gaps between the outer electrode 110 and inner electrode 120. Also, a power supplier 150 provides a voltage signal across the outer electrode 110 and inner electrode 120. The voltage signal can be AC voltage having an amplitude and frequency high enough to excite the gas and cause corona discharge (and/or dielectric-barrier discharge) at the gaps between the outer electrode 110 and inner electrode 120. The discharge is localized to regions surrounding the protrusions, because these regions are highly curved and therefore, have high electrical field strength. As a result, plasma formed via the discharge is also localized to these regions.

Figure 1B:
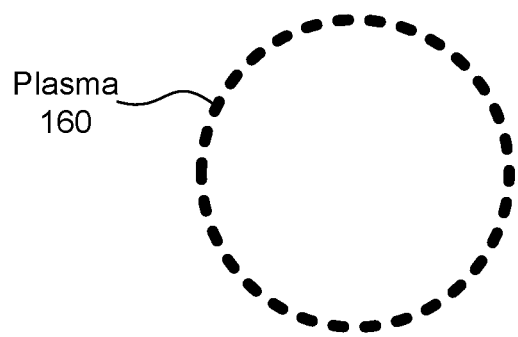
FIG. 1B illustrates a plasma generated by the plasma generator of FIG. 1A, in accordance with an embodiment.

FIG. 1B illustrates plasma 160 generated by the convention plasma generator 100 in FIG. 1A, in accordance with an embodiment. As shown in FIG. 1B, the plasma 160 is not evenly spread in the gas between the outer electrode 110 and inner electrode 120. Rather, the plasma 160 has higher density in the gaps between the protrusions 140 and the outer electrode 110 but lower or even zero density in the gaps between the body 130 and the outer electrode 110. When used for surface treatment, the uneven distribution of plasma 160 around the inner surfaces of the outer electrode 110 can cause non-uniform surface treatment and non-uniform characteristics of the treated surface.

Figure 2:
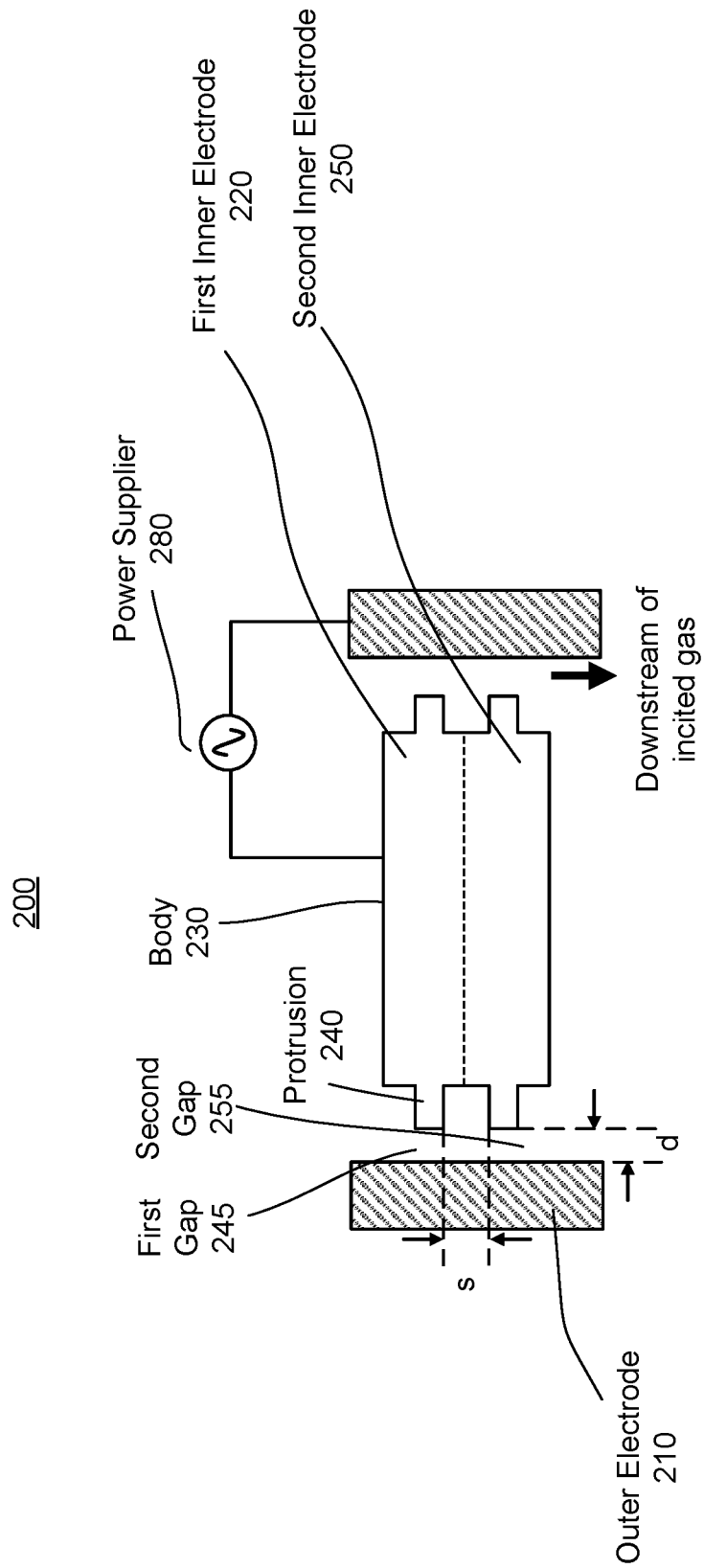
FIG. 2 is a schematic cross-sectional view of a two-phase plasma generator, in accordance with an embodiment.

FIG. 2 is a schematic cross-sectional view of a two-phase plasma generator 200, in accordance with an embodiment. The two-phase plasma generator 200 generates plasma that has more uniformly distributed density than the plasma 160 in FIG. 1B. The two-phase plasma generator 200 can be placed at a pressure of a wide range, for example, from less than 1 mTorr to atmospheric pressure.

As shown in FIG. 2, the two-phase plasma generator 200 may include, among other components, an outer electrode 210, a first inner electrode 220, and a second inner electrode 250. The three electrodes can be made from metal (such as copper, silver, or stainless steel) or a dielectric material that covers metal to generate DBD plasma. By covering the metal with the dielectric material, the metal does not come in contact with plasma, and thereby prevents erosion of the metal and results in cleaner plasma. The first and second inner electrodes 220 and 250 are enclosed in the outer electrode 210, and the second inner electrode 250 is attached to the first inner electrode 220. The first inner electrode 220 includes a body 230 and protrusions 240. The protrusions 240 are attached on the body 230 and extend towards the outer electrode 210. Each protrusion 240 forms a first gap 245 with the outer electrode 210. The second inner electrode 250 has a smooth surface facing the outer electrode 210. The smooth surface forms a second gap 255 with the outer electrode 210. More details regarding the configurations of the two inner electrodes 220 and 250 are described below in conjunction with FIGS. 6A-6C and FIGS. 7A-7D.

A gas can be injected into the first gaps 245. Examples of the gas include Nitrous oxide, Oxygen, Ozone, Ammonia, Helium, Neon, Argon, Hydrogen and Nitrogen. The flow direction of the gas is generally parallel to a direction from the first inner electrode 220 to the second inner electrode 250. Relative to the first inner electrode 220, the second inner electrode 250 is at a downstream location of the gas.

A power supplier 280 provides a voltage signal across the outer electrode 210 and the two inner electrodes 220 and 250. The power supplier 280 can be the same as the power supplier 150 in FIG. 1A. In the embodiment of FIG. 2, the second inner electrode 250 is conductively attached onto the first inner electrode 220 so that they are at a same voltage level but in other embodiments, different voltage signals may be applied to the first and second inner electrodes. The outer electrode 210 can be grounded.

The gas is excited twice in the plasma generator 200 in two plasma phases. In the first plasma phase, the gas is excited between the outer electrode 210 and first inner electrode 220. The excited gas can include, among others, excited gas molecules, dissociated gas molecules, and/or ionized gas molecules. The excitation of the gas results in first plasma. Similar to the plasma 160 in FIG. 1B, the first plasma is localized to the first gaps 245. The excited gas flows from the first gaps 245 to the second gap 255 and proceeds to second plasma phase where second plasma is generated in gap 255 between the second inner electrode 250 and the outer electrode 210. The plasma ignition threshold in the second plasma phase can be lowered by receiving the excited species and/or energized gas molecules from the first plasma phase.

In the embodiment of FIG. 2, the separation distance s between the first inner electrode 220 and second inner electrode 250 along the flow direction of the gas is larger than or equal to the separation distance d between the outer electrode 210 and the two inner electrodes 250 and 270. With such configuration of the outer electrode 210 and the two inner electrodes 250 and 270, the second plasma generated in the second plasma phase is more evenly spread between the outer electrode 210 and second inner electrode 250 than the first plasma between the outer electrode 210 and first inner electrode 220 by receiving downstream of excited species from the first plasma phase. In some embodiments, s is not larger than 10 times of d to receive and utilize the excited species and/or energized gas molecules from the downstream of the first phase plasma and for igniting and sustaining uniform the second phase plasma, preferably 1.5≤s/d≤5. In an embodiment where s is smaller than d, the second plasma is similar to the first plasma because of cross-talk or interference of two plasmas, the second plasma may not be distributed uniformly across the second gap 255.

Figure 3A:
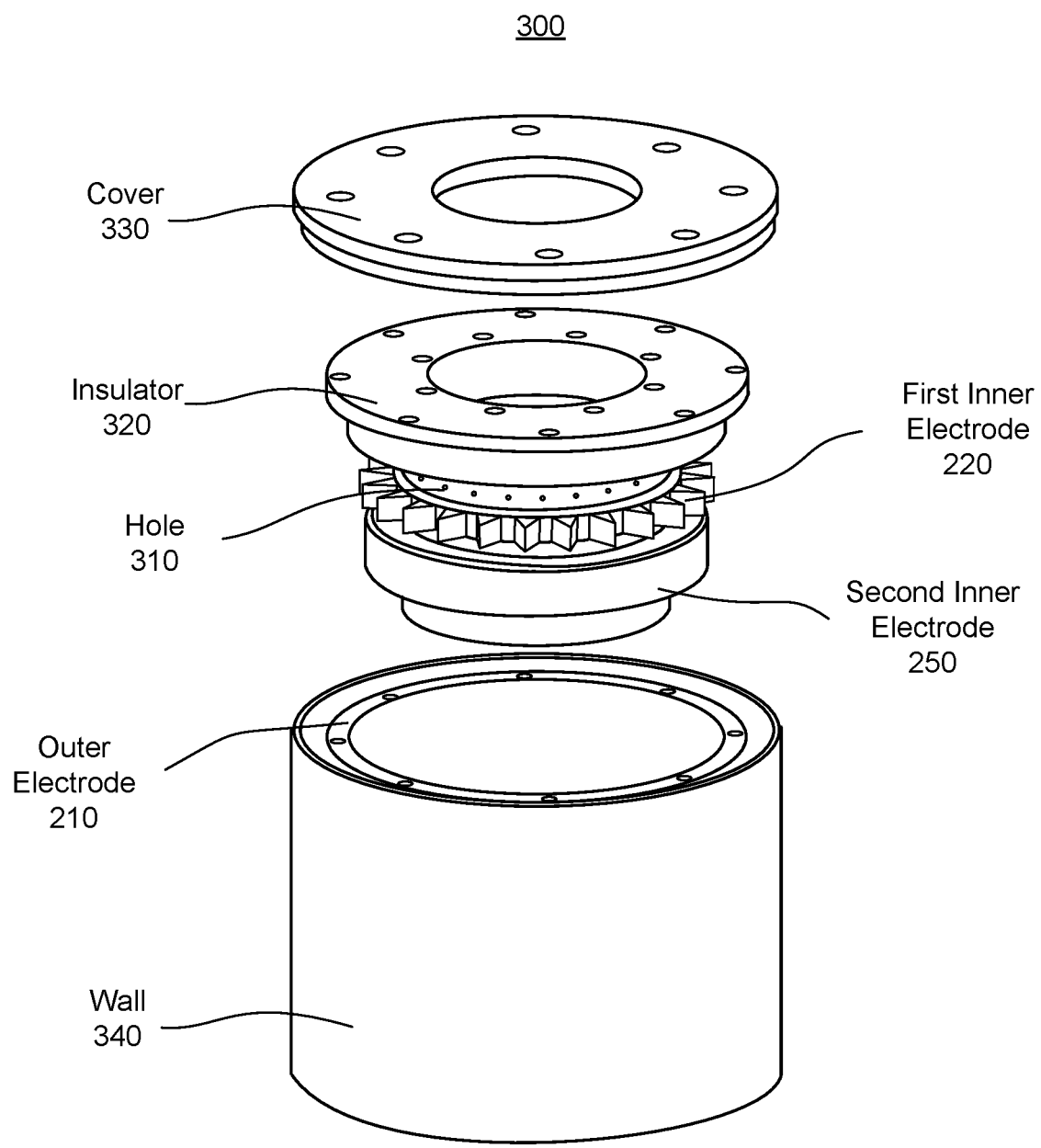
FIG. 3A is a prospective view of a cylindrical two-phase plasma generator, in accordance with an embodiment.

The two-phase plasma generator 200 can have various configurations. FIG. 3A is a prospective view of a cylindrical design of the two-phase plasma generator 300, in accordance with an embodiment. As shown in FIG. 3A, the first and second inner electrodes 220 and 250 each have a cylindrical body. The outer electrode 210 has a tubular shape to enclose the first and second inner electrodes 220, 250.

The circular design of the two-phase plasma generator 200 also includes one or more gas channels (not shown) and a plurality of holes 310 connected to the gas channels. The holes 310 are on top of the first inner electrode 220 and face the outer electrode 210. A gas for generating plasma can be injected through a center hole in a cover 330, a center hole in an insulator 320 into gas channels (not shown) connected to the holes 310. From the holes, the gas flows into gaps between the outer electrode 210 and first inner electrode 220, and then to gaps between the outer electrode 210 and second inner electrode 250.

Figure 3C:
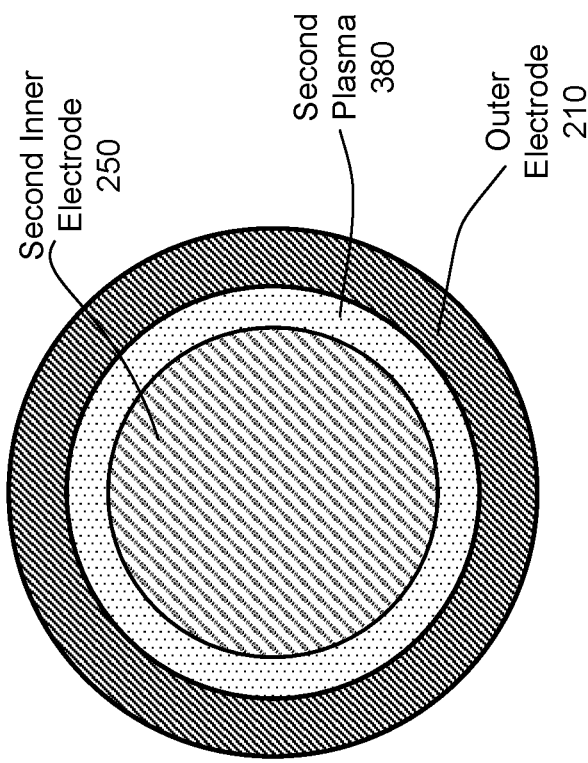
FIG. 3C is a cross-sectional view taken across a second inner electrode of FIG. 3A, in accordance with an embodiment.
Figure 3B:
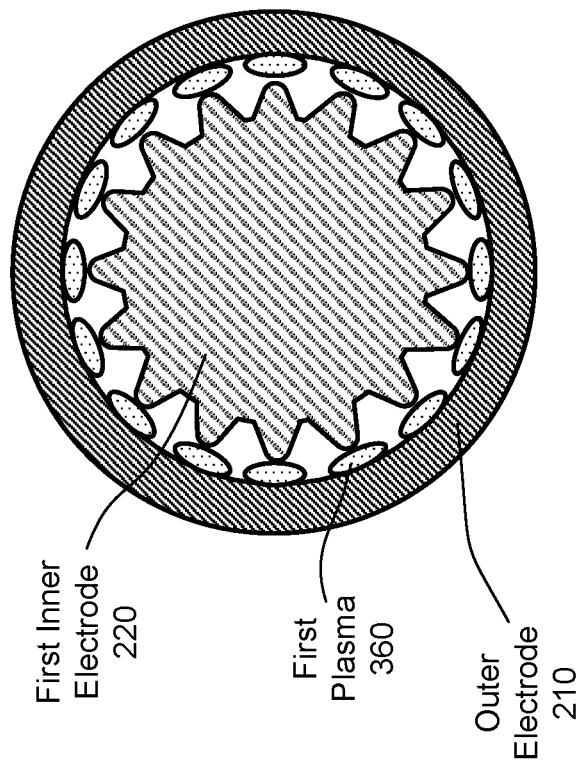
FIG. 3B is a cross-sectional view taken across a first inner electrode of FIG. 3A, in accordance with an embodiment.

FIG. 3B illustrates the first plasma generated in the first phase, and FIG. 3C illustrates the second plasma generated in the second phase of the cylindrical two-phase plasma generator 300, in accordance with an embodiment. FIG. 3B illustrates the outer electrode 210, the first inner electrode 220, and first plasma 360 generated in the first plasma phase. The first plasma 360 is localized at the first gaps between the protrusions of the first inner electrode 220 and the outer electrode 210. FIG. 3C illustrates the outer electrode 210, the second inner electrode 250, and second plasma 380 generated in the second plasma phase. Compared with the first plasma 360, the second plasma 380 is more uniformly distributed across the outer surface of the second inner electrode 250 and the outer electrode 210 by receiving downstream of excited species from the first plasma phase.

Figure 4A:
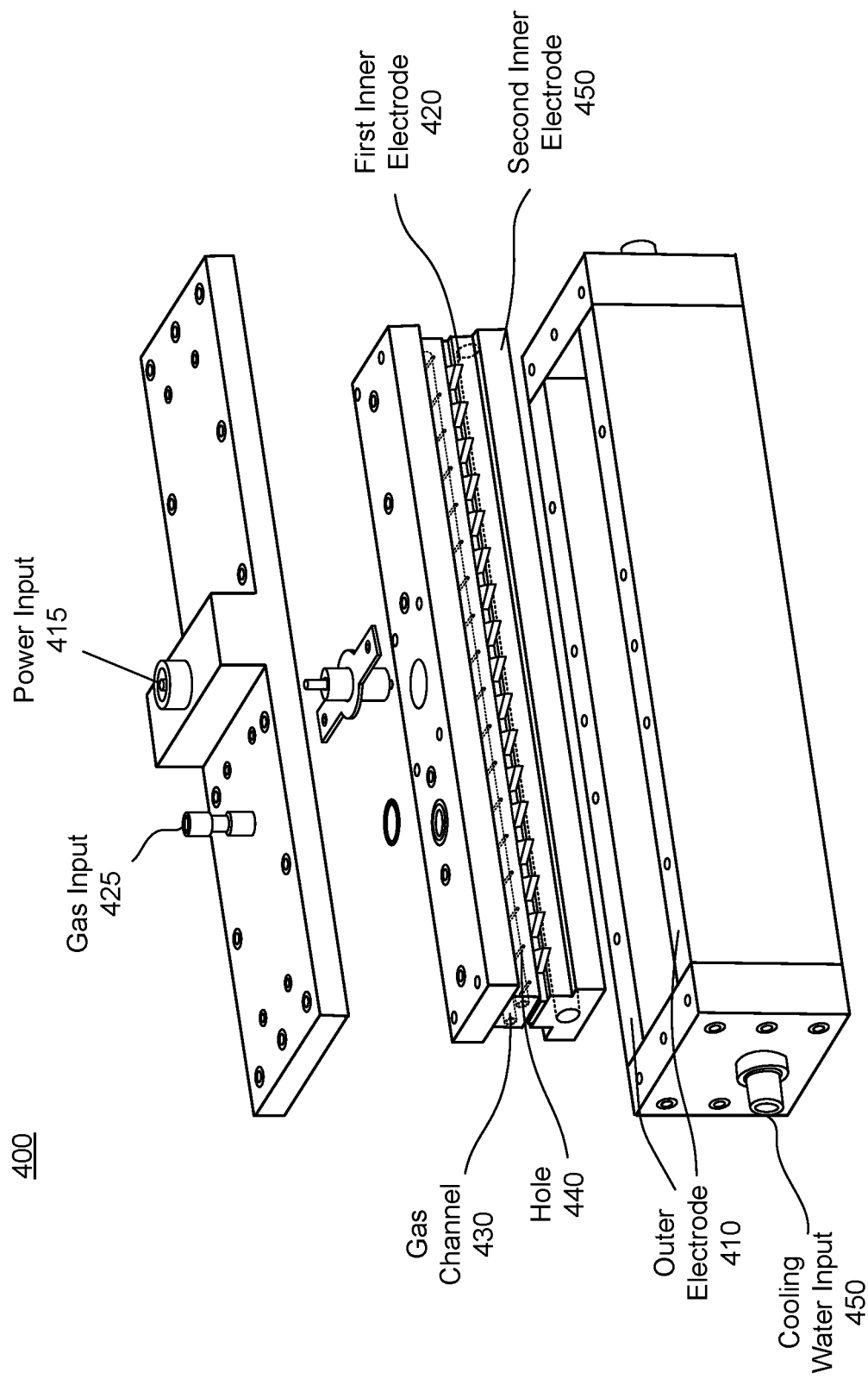
FIG. 4A is a prospective view of a rectangular two-phase plasma generator, in accordance with an embodiment.

FIG. 4A is a prospective view of a rectangular two-phase plasma generator 400, in accordance with an embodiment. As shown in FIG. 4A, the first inner electrode 420 and second inner electrode 450 have a rectangular cross-sectional shape. The outer electrode 410 includes two conductive elements, each of which also has a rectangular cross-section. The first and second inner electrodes 420, 450 are placed between the two conductive elements. In some embodiments, the two conductive elements are connected to each other through an electrical wire so that they are at the same voltage level while in other embodiment, the two conductive elements of the outer electrode 410 are connected to different power suppliers and may be at different voltage levels. In other embodiment, the two conductive elements of the inner electrodes 420, 450 are electrically isolated and each inner electrode can be connected to different power suppliers for separate plasma controls such as voltage, current, frequency and phase. More details regarding power supply of the rectangular two-phase plasma generator are described below in conjunction with FIGS. 5A through 5C.

The rectangular two-phase plasma generator 400 also includes a power input 415, a gas input 425, two gas channels 430, a plurality of holes 440, and a cooling water input 450. The power input 415 is connected to a power supplier to provide a voltage signal to the rectangular two-phase plasma generator 400. The gas input 425 receives a gas injected into the rectangular two-phase plasma generator. The gas flows into the gas channels 430. The gas channel(s) 430 directs the gas into the holes 440 so that the gas is ejected into gaps between the first inner electrode 420 and the outer electrode 410. The cooling water input 450 receives water that circulates within the rectangular two-phase plasma generator 400 to cool down heat from the generation of plasma.

Figure 4C:
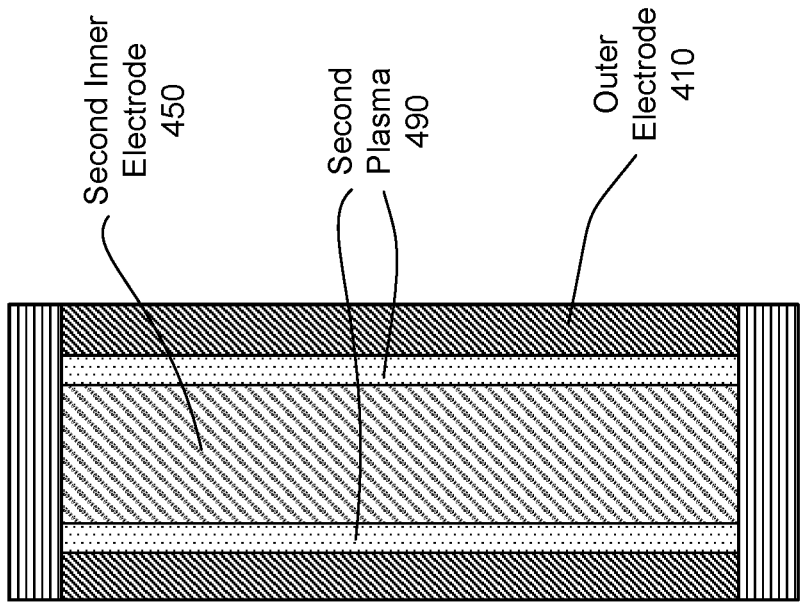
FIG. 4C is a cross-sectional view taken across a second inner electrode of FIG. 4A, in accordance with an embodiment.
Figure 4B:
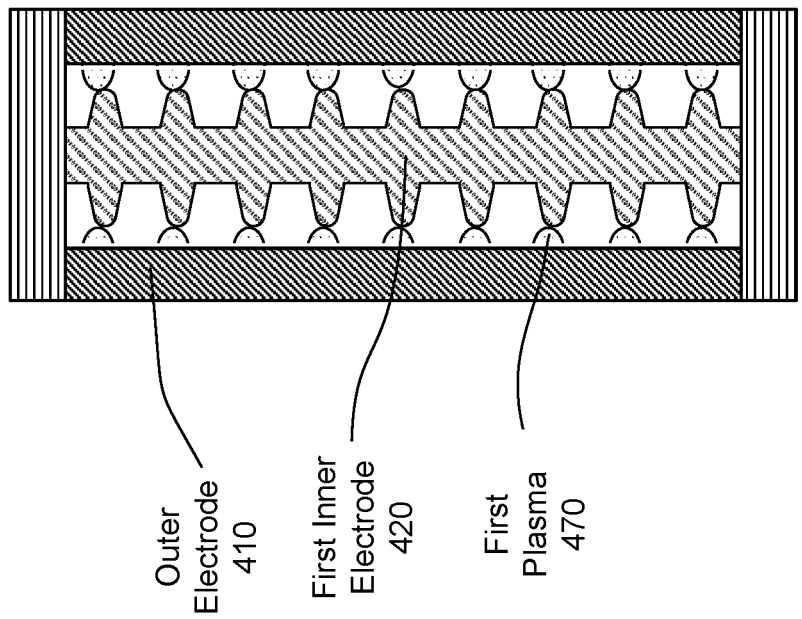
FIG. 4B is a cross-sectional view taken across a first inner electrode of FIG. 4A, in accordance with an embodiment.

FIG. 4B illustrates first plasma 470 generated by the rectangular two-phase plasma generator 400, in accordance with an embodiment. FIG. 4C illustrates second plasma 490 generated by the rectangular two-phase plasma generator, in accordance with an embodiment. FIG. 4A illustrates the outer electrode 410, the first inner electrode 420, and first plasma 470. The first plasma 470 is localized at the gaps between the protrusions of the first inner electrode 420 and the outer electrode 410. FIG. 4B illustrates the outer electrode 410, the second inner electrode 450, and second plasma 490. As shown in FIGS. 4A and 4B, the second plasma 490 is more evenly distributed compared to the first plasma 470.

Figure 5B:
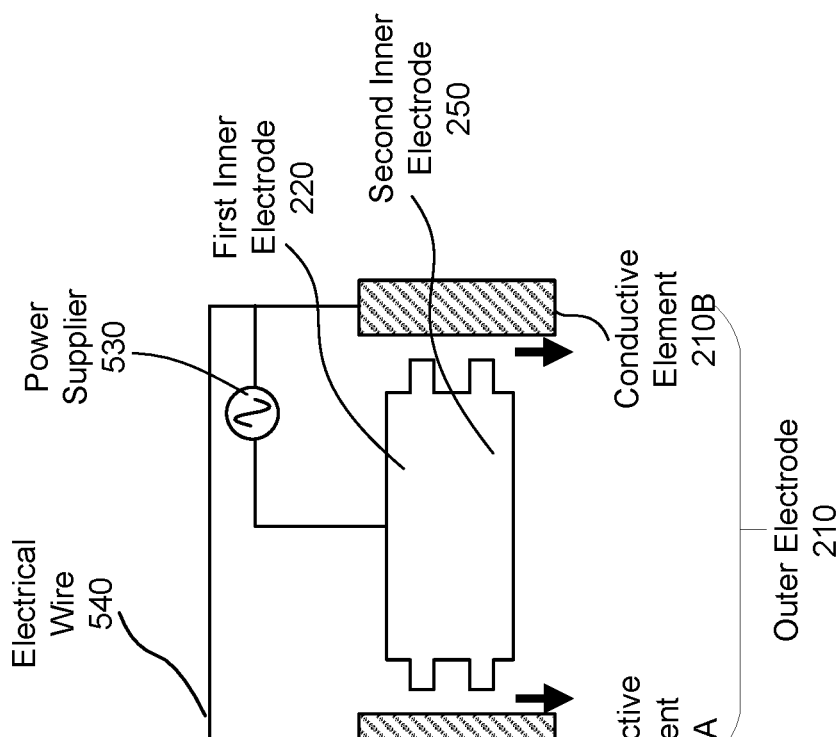
FIGS. 5A through 5C are schematic diagrams illustrating different types of power supply for the two-phase plasma generator, in accordance with an embodiment.
Figure 5A:
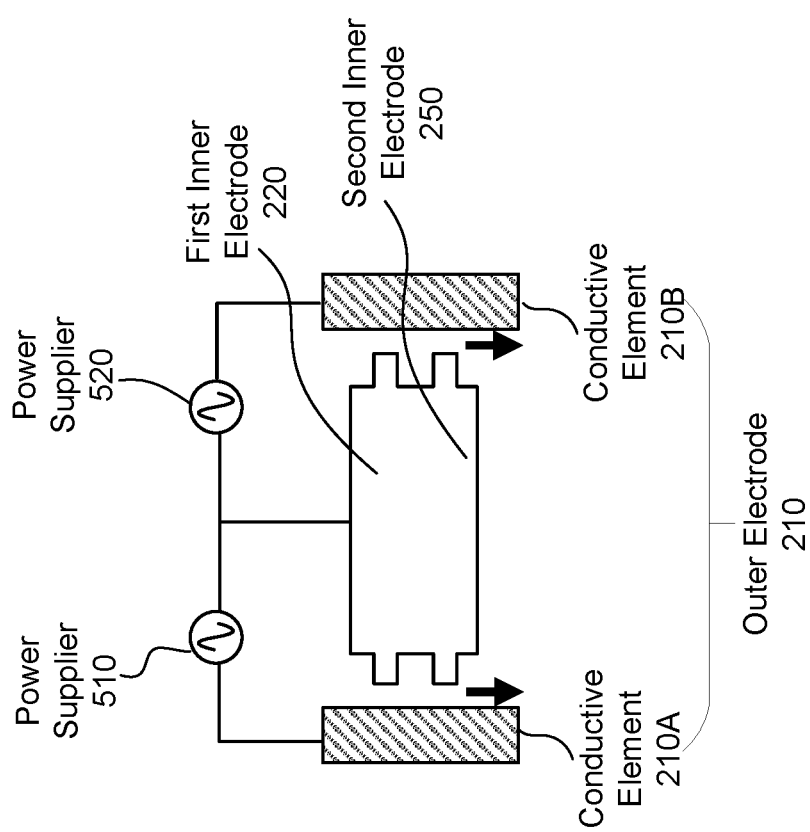
Figure 5C:
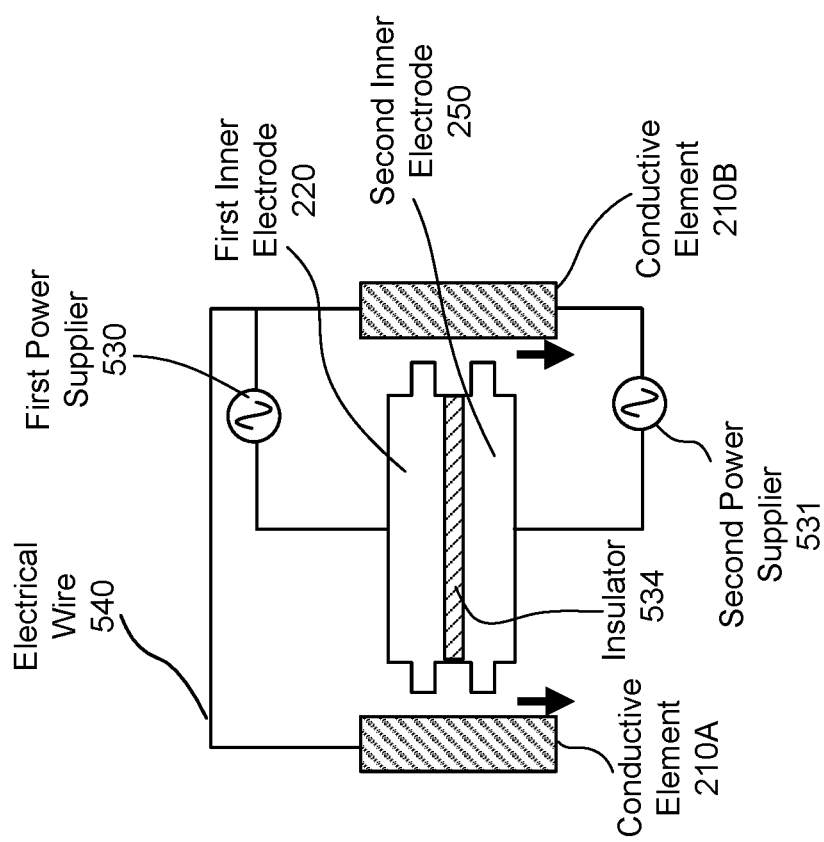

FIGS. 5A through 5C illustrate three different types of power supply for the rectangular design of the two-phase plasma generator 200, in accordance with an embodiment. In FIG. 5A, the outer electrode 210 includes two conductive elements 210A and 210B, which are connected to two power suppliers 510 and 520, respectively. The power supplier 510 provides a first voltage signal across the conductive element 210A and the two inner electrodes 220 and 250. The surfaces of the conductive element 210A and the two inner electrodes 220 and 250 can be a metal or dielectric covering metal. The power supplier 520 provides a second voltage signal across the conductive element 210B and the two inner electrodes 220 and 250. The first and second voltage signals can be different, for example, in terms of frequency, amplitude and/or phase by using two power supplies.

In FIG. 5B, the two-phase plasma generator 200 is connected to one power supplier 530. An electrical wire 540 connects the conductive elements 210A and 210B so that they are at the same voltage. In one example, the electrical wire 540 is a common wire and the conductive elements 210A and 210B are commonly grounded. In the embodiment of FIG. 5B, a same voltage is applied across the inner electrodes 220 and 250 and the two conductive elements 210A and 210B.

In FIG. 5C, the first and second power suppliers 530, 531 are connected to the first inner electrode 220 and second inner electrode 250, respectively, to provide separate voltage signals across the conductive element 210A, 210B and the two inner electrodes 220 and 250. The first and second voltage signals can be varied to control two different phases of plasmas separately, for example, in terms of frequency and/or amplitude and/or phase by using two power supplies. To electrically insulate the first inner electrode 220 and the second inner electrode 250, an insulator 545 may be placed between the two electrodes 220, 250.

Despite the circular design shown in FIGS. 3A-3B and the rectangular design shown in FIGS. 4A-4B and 5A-5C, the two-phase plasma generator 200 can have other designs that include electrodes of different shapes to generate plasma of different shapes.

Figure 6A:
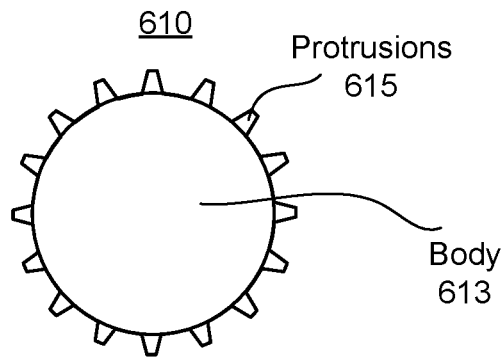
FIGS. 6A through 6C illustrate various configurations of the two inner electrodes of the two-phase plasma generator, in accordance with embodiments.
Figure 6B:
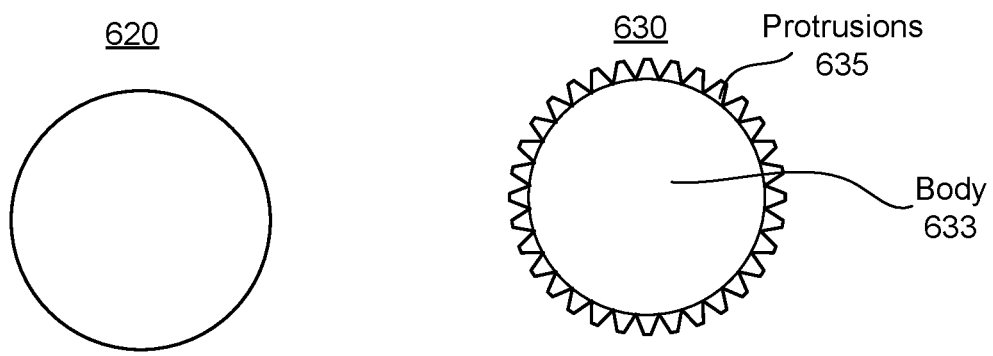
Figure 6C:
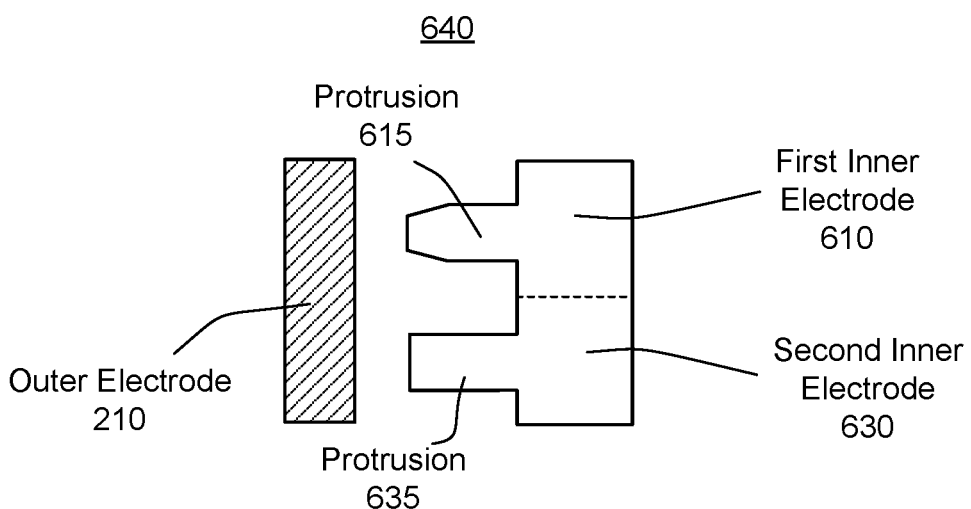

FIGS. 6A-6C illustrate various configurations of the two inner electrodes 220 and 250 of the two-phase plasma generator 200, in accordance with an embodiment. For purpose of illustration, the various configurations of the two inner electrodes shown in FIGS. 6A-6C have cylindrical bodies but in other embodiments, the two inner electrodes can have different shapes.

FIG. 6A shows a top view of an example first inner electrode 610, according to one embodiment. The first inner electrode 610 includes a body 613 and protrusions 615 that extend along the outer periphery of the body 613. FIG. 6B shows top views of two example second inner electrodes 620 and 630, according to embodiments. Each of the second inner electrodes 620 and 630 can be paired with the first inner electrode 610 in FIG. 6A. The second inner electrode 620 does not have protrusions and has a smooth surface along the periphery. The second inner electrode 630 includes a body 633 and protrusions 635 that extend from the body 633. The second inner electrode 630 has more protrusions than the first inner electrode 610. In one embodiment, the number of the protrusions 635 is twice or more than the number of the protrusions 615.

Each protrusion 615 or 635 may have different cross-sectional shapes. For example, FIG. 6C shows of the first inner electrode 610 attached on the second inner electrode 630. In the embodiment of FIG. 6C, the side of the protrusions 615 have a wedge shaped or sharp edged cross-section while the protrusions 635 have a square shaped or flat cross-section.

FIGS. 7A-7D illustrate various designs of spatial separation between the outer electrode 210 and the two inner electrodes 220 and 250 of the two-phase plasma generator 200, in accordance with various embodiments. In FIGS. 7A-7D, d1 is a separation distance between the first inner electrode 220 and the outer electrode 210, d2 is a separation distance between the second inner electrode 250 and the outer electrode 210, s is a distance from the first inner electrode 220 to the second inner electrode 250 along the flow direction of the gas, and T is a width of the second inner electrode 250 along the flow direction of the gas flow. In one embodiment, d1 is no less than 0.1 mm and d2 is no larger than 10 mm. Also, s is larger than or equal to d1 so that the excited gas travels a distance at least equal to d1 for generating the second plasma that is more evenly spread. The first inner electrode 220 has a first area taken along a section that is perpendicular to the flow direction of the gas, and the second inner electrode 250 has a second area taken along another section that is perpendicular to the flow direction of the gas. In some embodiments, the size of the first area depends on d1 and the size of the second area depends on d2.

In the design shown in FIG. 7A, d1 equals d2. The first area of the first inner electrode 220 has the same size as the second area of the second inner electrode 250 because the first and second inner electrodes 220, 250 have the same cross section that is perpendicular to the flow direction of the gas. The first plasma is generated by corona discharge and/or dielectric barrier discharge surrounding the protrusions of the first inner electrode 220. The excited gas then flows to a gap between a smooth surface of the second inner electrode 250 and the outer electrode 210, where the second plasma is formed. In FIG. 7B, d2 is larger than d1 to receive downstream of the excited gas. The first area is larger than the second area because of the first inner electrode 220 has a narrower gap between the outer electrode 210 relative to the second inner electrode 250. The second electrode 250 in FIG. 7B can either has a smooth surface facing the outer electrode 210 or a plurality of protrusions extending towards the outer electrode 210. In FIG. 7C, d1 is larger than d2. The second area is larger than the first area because the second inner electrode 250 has a narrower gap between the outer electrode 210 relative to the first inner electrode 220. The second inner electrode 250 has a smooth surface facing the outer electrode 210 for generating the second plasma that is more evenly spread out. In FIGS. 7A-7C, a dimension of the first inner electrode 220 along the flow direction of the gas is the same as that of the second inner electrode 250.

FIG. 7D shows a different design, where the width of the second inner electrode 250 along the flow direction of the gas (T) is larger than that of the second inner electrode 250. Accordingly, the second inner electrode 250 has a larger area facing the outer electrode 210. Also, T is larger than s and d1 equals d2. The second inner electrode 250 has a smooth surface facing the outer electrode 210, which forms a gap with the outer electrode 210. Besides the second plasma generated from the excited gas, capacitively coupled plasma can also be generated in the gap. As variations of the embodiment of FIG. 7D, different distance of d2 from d1 can be also adopted. Each of the designs in FIGS. 7A-7D can be used in a circular two-phase plasma generator (such as the one shown in FIG. 3A) or a rectangular two-phase plasma generator (such as the one shown in FIG. 3B).

Figure 8:
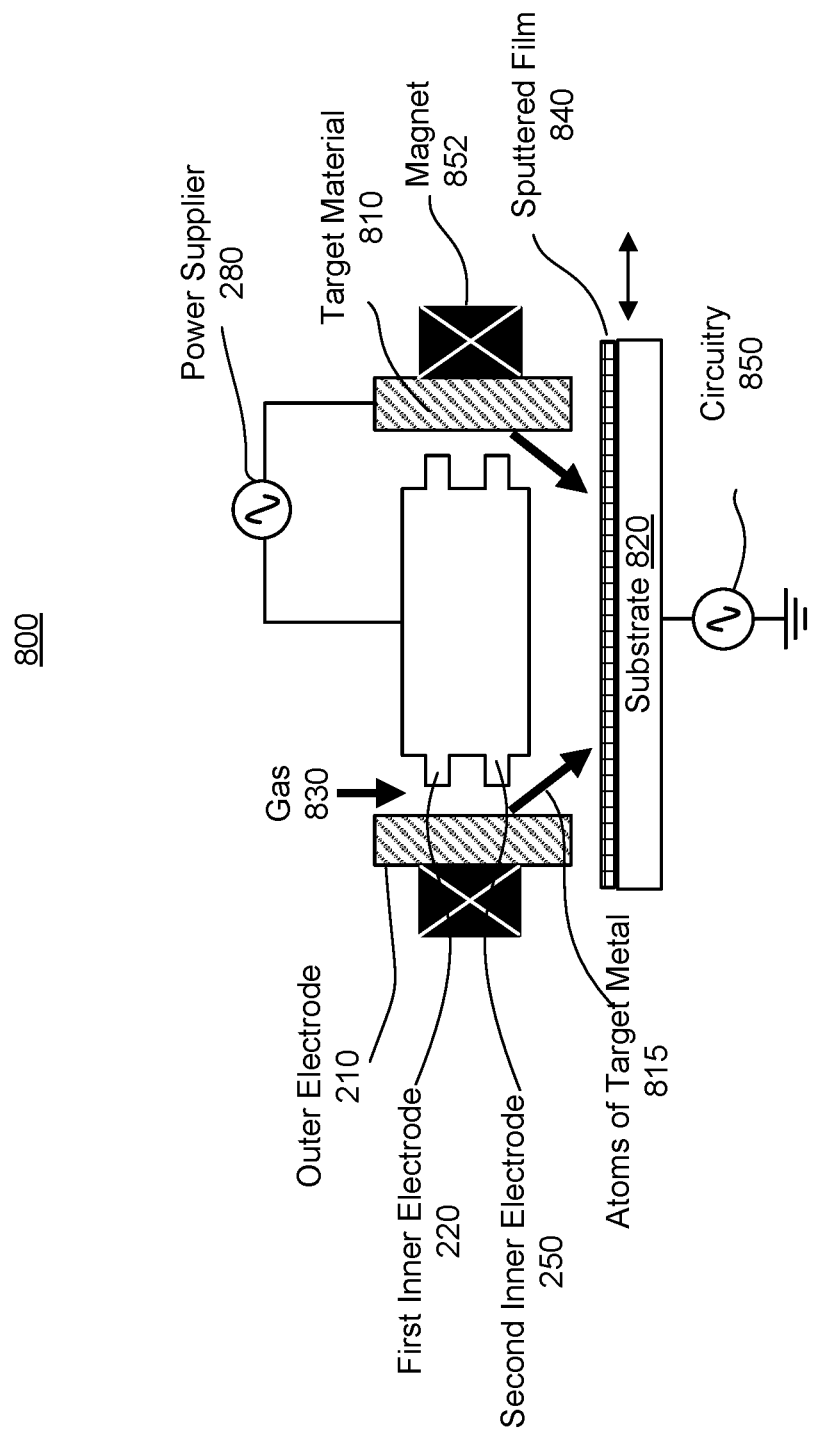
FIG. 8 is a schematic cross-sectional view of a sputtering system using a two-phase plasma generator, in accordance with an embodiment.

FIG. 8 is a schematic view of a sputtering system 800, in which the two-phase plasma generator 200 is used for sputtering a target material 810 onto a substrate 820 in accordance with an embodiment. The substrate 820 can be made from a variety of materials, such as glass, polymer, paper, fabric, membrane, a gas permeable film, and so on. The substrate 820 includes a flat surface facing the sputtering system 800. In one embodiment, the sputtering system 800 operates in a pressure in a range from 1 mTorr to atmospheric pressure. The target metal is on a surface of the outer electrode 210 that faces the inner electrodes 220 and 250. In one example, the outer electrode 210 is made from the target metal. The target material can either be a metal or a dielectric material. Examples of the target metal include Al, Cu, Ag, Ti, Ta, Co, Ni, W, Pt, Au, and inorganic target such as $Al_2O_3$, $SiO_2$, $TiO_2$, SiN, and AlN.

A gas 830 is injected into the two-phase plasma generator 200. Examples of the gas include Ar, $Ar/N_2$ mixed gas, $Ar/NH_3$ mixed gas, $Ar/O_2$ mixed gas, $N_2O$, $N_2$, $O_2$, and $CO_2$. The power supplier 280 provides a voltage signal having an amplitude in a range from 1 kV to 30 kV to excite the gas 830 to form plasma uniformly spread at the gap between the second inner electrode 250 and the outer electrode 210. Under the plasma, atoms 815 of the target material 810 is sputtered onto a target area of the substrate 820, forming a sputtered film 840 on top of the substrate 820. The sputtered film 840 is a layer of the target metal. In some embodiment, the power supplier 280 provides a DC voltage signal for sputtering conductive materials, such as metal or conductive metal-oxides or metal-nitrides, and provides a RF voltage signal for sputtering non-conductive metal-oxides or metal-nitrides. In the embodiment of FIG. 8, the substrate 820 is biased. A circuitry 850 provides a bias voltage between the substrate 820 and ground. The bias may be increased to increase the energy of the sputtered atoms at the surface of the substrate to improve adhesion, nucleation and crystal structure of the film.

As shown in FIG. 8, a pair of magnets 852 are placed on a surface of the outer electrode 210 away from the inner electrodes 220 and 250. The magnets 852 increase the density of the plasma by confining the plasma and maintaining a higher density of ions to the region surrounding the target area on the substrate.

Figure 9:
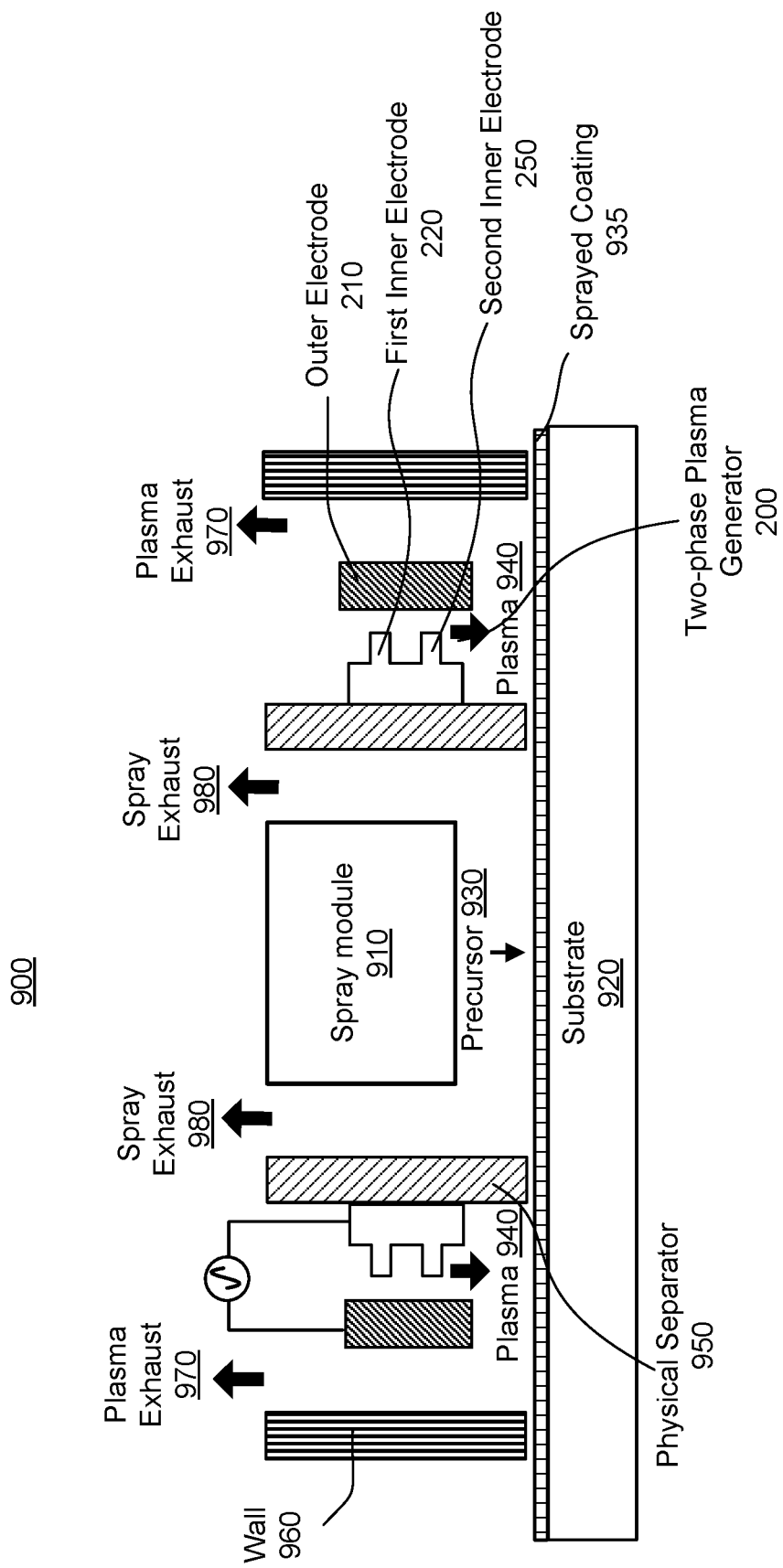
FIG. 9 is a schematic view of a spraying system including a two-phase plasma generator for spraying a material onto a substrate, in accordance with an embodiment.

FIG. 9 is a schematic view of a spraying system 900, which includes a spray module 910 enclosed in the two-phase plasma generator 200 for spraying a material onto a moving substrate 920, in accordance with an embodiment. The substrate 920 can be made of the same material as the substrate 820 in FIG. 8. The spraying system 900 operates at a temperature lower than the melting temperature (or glass transition temperature) of the substrate 920.

The spray module 910 locates at the center of the two-phase plasma generator 200 and sprays a precursor 930, either in gas-phase or liquid-phase, to the substrate 920 that moves from left to right or right to left. A layer of sprayed film 935 is formed on the top surface of the substrate 920. Plasma 940 generated by the two-phase plasma generator 200 assists the spraying process. For example, the plasma 940 is used to treat the top surface of the substrate 920 (e.g., to clean the top surface of the substrate 920) before the precursor 930 is sprayed. Further, by moving the substrate 920, the plasma 940 can be used to treat and form the sprayed film from the sprayed (molecule) layer. The spray module 910 is separated from the two-phase plasma generator 200 with a physical separator 950 to avoid reaction of the plasma 940 with the precursor 930. In the embodiment of FIG. 9, the two-phase plasma generator 200 is enclosed in a wall 960 of the spraying system 900 and plasma exhaust 970 exists waste gas(es) and by-products which are generated with the exposure or the downstream of the plasma 940 from the spraying system 900 from a gap between the wall 960 and the two-phase plasma generator 200. Spray exhaust 980 exists waste precursor and/or non-polar solvent or polar solvent from the spraying system 900 from a gap between the physical separator 950 and the spray module 910.

Figure 10:
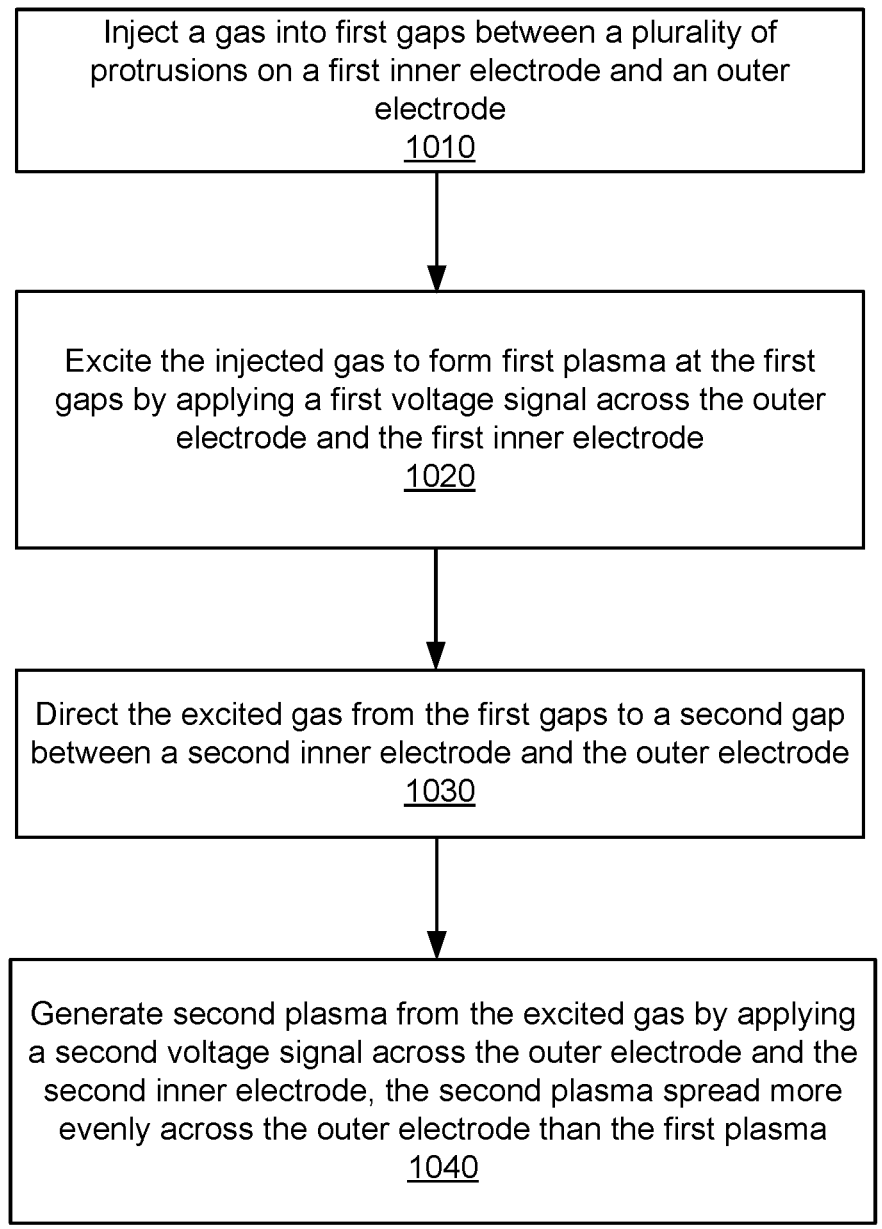
FIG. 10 is a flow chart illustrating a process for generating uniform plasma, in accordance with an embodiment.

FIG. 10 is a flow chart illustrating a process for generating uniform plasma, in accordance with an embodiment. The process may include different or additional steps than those described in conjunction with FIG. 10 in some embodiments or perform steps in different orders than the order described in conjunction with FIG. 10.

A gas is injected 1010 into first gaps between a plurality of protrusions on a first inner electrode and an outer electrode. Examples of the gas include Nitrous oxide, Oxygen, Ammonia, Helium, Neon, Argon, Hydrogen and Nitrogen. In some embodiments, there are holes on a surface of the first inner electrode facing the outer electrode. The holes are connected to one or more gas channels that are formed on the first inner electrode so that the holes can eject the gas into the first gaps.

The injected gas is excited 1020 to form first plasma at the first gaps by applying a first voltage signal across the outer electrode and the first inner electrode. Because the protrusions of the first inner electrode have protrusions, corona discharges are formed in the first gaps. Thus, the first plasma has high density in certain regions but has low density or even zero density in other regions between the outer electrode and first inner electrode.

The excited gas is directed 1030 from the first gaps to a second gap between a second inner electrode and the outer electrode. A separation distance from the first inner electrode to the second inner electrode in the flow direction of the gas is larger than or equal to a dimension of the first gap in the direction perpendicular to the flow direction of the gas.

Second plasma is generated 1040 from the excited gas responsive to applying a second voltage signal across the outer electrode and the second inner electrode. The second plasma spreads more evenly than the first plasma. The second plasma has uniformly distributed density and can be used for uniform surface treatment in a wide pressure range from 1 mTorr to atmospheric pressure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A plasma generator, comprising:
   an outer electrode;
   a first inner electrode comprising a first body and a plurality of first protrusions that extend towards the outer electrode, the plurality of protrusions with the outer electrode defining first gaps, the first inner electrode configured to excite a gas to generate first plasma localized at the first gaps, responsive to applying a first voltage signal across the outer electrode and the first inner electrode;
   a second inner electrode at a downstream location of the excited gas relative to the first inner electrode, the second inner electrode having an outer surface that forms a second gap with the outer electrode, the second inner electrode configured to generate second plasma from the excited gas, responsive to applying a second voltage signal across the outer electrode and the second inner electrode, wherein the second plasma is spread more evenly across the outer surface and the outer electrode than the first plasma; and
   an insulator arranged between the first inner electrode and second inner electrode,
   wherein the first inner electrode, second inner electrode, and insulator are enclosed by the outer electrode.

2. The plasma generator of claim 1, wherein the plasma generator is placed under atmospheric pressure.

3. The plasma generator of claim 1, the first inner electrode has a first area taken along a section that is perpendicular to a flow direction of the gas, and the second inner electrode has a second area taken along another section that is perpendicular to the flow direction of the gas, the second area larger than the first area.

4. The plasma generator of claim 3, wherein the second inner electrode comprises a second body and a plurality of second protrusions extending from the second body, a number of the second protrusions more than the number of first protrusions.

5. The plasma generator of claim 3, wherein the second inner electrode has a smooth outer surface facing the outer electrode.

6. The plasma generator of claim 1, wherein each of the first inner electrode and second inner electrode has a cylindrical body and the outer electrode has a tubular shape.

7. The plasma generator of claim 1, wherein the first inner electrode, second inner electrode, and outer electrode have rectangular cross-sections.

8. The plasma generator of claim 1, wherein a separation distance between the plurality of protrusions of the first inner electrode and the outer electrode is larger than a separation distance between the outer surface of the second inner electrode and the outer electrode.

9. The plasma generator of claim 1, wherein a dimension of the second inner electrode along a direction of flow of the gas is larger than a distance between the first inner electrode and the second inner electrode along the direction of flow of the gas.

10. The plasma generator of claim 1, wherein a distance from the first inner electrode to the second inner electrode along a direction of flow of the gas is equal to or larger than a separation distance between the plurality of protrusions of the first inner electrode and the outer electrode.

11. The plasma generator of claim 1, further comprising a gas channel and holes connected to the gas channel to direct the gas into the first gap.

12. The plasma generator of claim 1, further comprising a circuitry configured to electrically bias a substrate closer to the second inner electrode than the first inner electrode to promote moving of charge in the gas from the first gaps to the second gap.

13. The plasma generator of claim 1, further comprising a pair of magnets outside the outer electrode to increase density of the generated plasma.

14. The plasma generator of claim 1, wherein the plasma generator encloses a spray module configured to spray a material onto a substrate.

15. The plasma generator of claim 1, wherein the outer electrode includes a target metal to be sputtered onto a substrate by using the plasma generated by the plasma generator.

\* \* \* \* \*